United States Patent [19]

Chilluffo et al.

[11] Patent Number: 4,468,633
[45] Date of Patent: Aug. 28, 1984

[54] ADJUSTABLE MICROWAVE POWER COMBINER FOR A PLURALITY OF COAXIALLY MOUNTED IMPATT DIODES

[75] Inventors: Ronald L. Chilluffo, Coral Springs; Gary D. Kelpien, Pompano Beach, both of Fla.

[73] Assignee: The Bendix Corporation, Southfield, Mich.

[21] Appl. No.: 372,596

[22] Filed: Apr. 28, 1982

[51] Int. Cl.$^3$ .......................... H03B 7/14; H03B 9/12
[52] U.S. Cl. .......................................... 331/56; 331/96; 331/101; 331/107 G; 331/107 R; 330/287
[58] Field of Search ..................... 330/287; 331/48, 55, 331/56, 96, 101, 107 G, 107 T, 107 C, 107 P, 107 R

[56] References Cited

U.S. PATENT DOCUMENTS

| | | | |
|---|---|---|---|
| 3,931,587 | 1/1976 | Harp et al. | 331/56 |
| 4,097,821 | 6/1978 | Lampen et al. | 331/107 C X |
| 4,121,174 | 10/1978 | Aston | 331/48 |
| 4,172,240 | 10/1979 | Jerinic | 331/101 X |
| 4,359,700 | 11/1982 | Tresselt | 330/287 X |

OTHER PUBLICATIONS

Power Combining of X-Band IMPATT Circuit Modules, Harp et al.-THPM 10.3-Feb. 15, 1973-IEEE ISSCC.
Imp. in Bandwidth & Freq. Capability of Microwave Power Combinatorial Techniques, Harp et al.-THAM 9.2-Feb. 14, 1974-IEEE ISSCC.

Primary Examiner—Eugene R. LaRoche
Assistant Examiner—W. R. Paxman
Attorney, Agent, or Firm—Bruce L. Lamb

[57] ABSTRACT

A typical coaxial circuit which couples a negative resistance diode to the cavity of a power combiner consists of a metallic rod which is biased by a spring against the diode supported by a carrier which is effective to vary the position of the diode along the longitudinal axis of the rod. The rod cooperates with bores in a block to comprise, in series, between the diode and the cavity, a transmission line whose length varies in accordance with diode position, a fixed impedance transformer and a fixed length transmission line.

8 Claims, 6 Drawing Figures

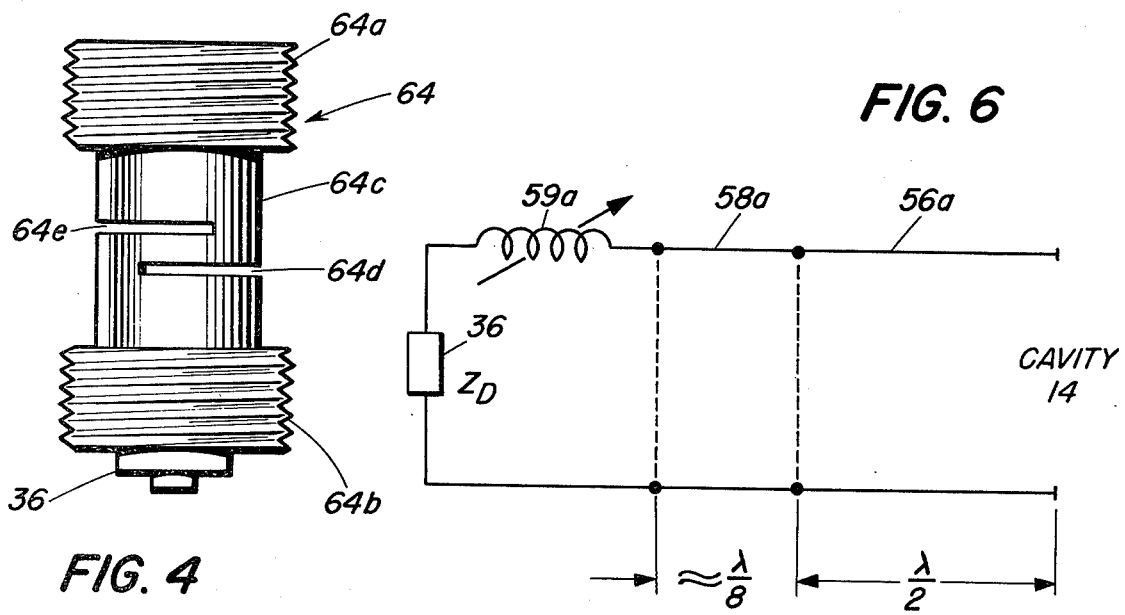
FIG. 4
FIG. 6
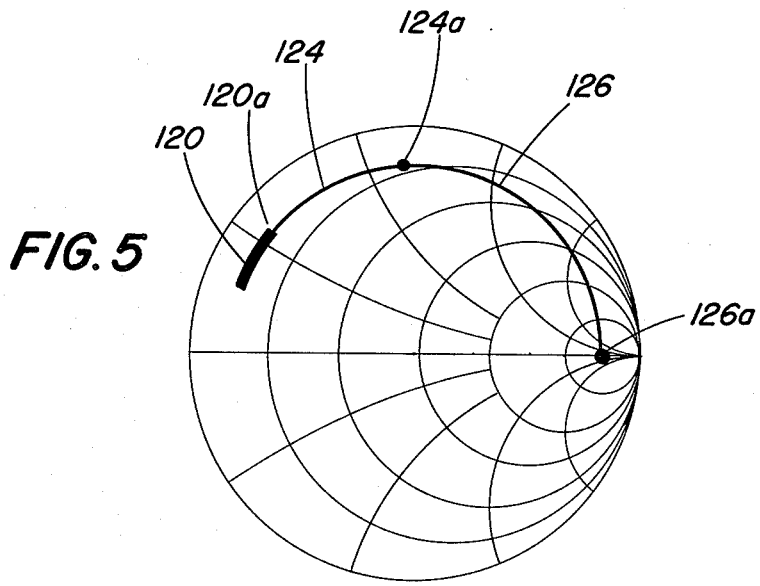
FIG. 5

ADJUSTABLE MICROWAVE POWER COMBINER FOR A PLURALITY OF COAXIALLY MOUNTED IMPATT DIODES

This invention relates to solid state microwave devices having a plurality of cooperating microwave avalanche diodes such as those diodes normally termed IMPATT diodes and more particularly to means for tuning the individual diodes.

Recent advances in solid state technology have led to the availability of both CW and pulsed IMPATT gallium arsenide diodes which have superior DC to RF power conversion efficiency over those of the prior art and more readily available silicon solid state devices. The RF power output from an individual gallium arsenide diode is, of course, relatively small. Thus, in order to achieve power levels high enough for system uses, it is normal to sum the power output of several diodes in a coaxial or waveguide microwave resonator such as a combiner of the $TM_{010}$, TEM or similar mode varieties. In a typical power combiner for combining the output of multiple IMPATT diodes of the prior art, such as described in U.S. Pat. No. 4,121,174 and in the pending U.S. patent application Ser. No. 194,746 filed Oct. 7, 1980, now U.S. Pat. No. 4,359,700, entitled Balancing Network for Microwave Power Combiner by Tresselt, which patent application is assigned to the assignee of the present invention, consists of a housing having a centrally disposed resonant cavity, around which is disposed in a coaxial relationship a plurality of oscillator circuits wherein the output is combined in the resonator cavity which includes a common output. Each oscillator circuit comprises a negative resistance semiconductor diode, such as an IMPATT diode, coupled into the centrally disposed resonant cavity by a fixed length low impedance transformer and coaxial transmission line in the form of a single unitary metallic rod. Such a metallic rod has an expanded cylindrical section which comprises the fixed length low impedance transformer, the end of which bears directly on and contacts the cathode of the diode. The rod is generally spring loaded against the diode not only to insure good electrical contact and provide a means of vibration insensitivity but also to permit diode tuning. This is accomplished by adjusting the position of the diode longitudinally, at the end of the rod against the spring load to thereby adjust the length of the coaxial transmission line portion of the rod. According to a second tuning scheme the IMPATT diode is coupled directly into the cavity by the low impedance transformer. This second scheme eliminates the adjustable transmission line which in the first scheme coupled the low impedance transformer to the cavity. Since, according to the first scheme mentioned above, the tuning was performed by adjusting the length of the microwave transmission line coupling the low impedance transformer to the cavity, that is, the tuning was performed on an impedance transformed by the low impedance transformer, a relatively large range of diode position adjustment capability was required to accommodate the impedance ranges of the various diodes within a given type. This, of course, led to the problem of practical physical embodiment of the tuning mechanism. For example, the extended range of spring compression compromised efforts to hold physical dimensions of the tuning structure to a minimum size. In addition, since tuning was accomplished subsequent to impedance transformation, the tuning was less effective in adjusting series inductance, the principal variant characteristic among diodes of a given type.

The above mentioned second tuning scheme wherein a typical diode is coupled directly into the cavity via a low impedance transformer, cured the problem of relatively large range of diode position adjustment capability of the first scheme. However, since, in essence, according to the second scheme tuning was accomplished by adjusting the impedance transformation, extremely small movement of a diode relative to the cavity produced extremely large tuning changes, resulting in very critical and difficult tuning. Further, the undesired change in the real portion of impedance caused by the tuning procedure, is not effectively cured.

SUMMARY OF THE INVENTION

The present invention is embodied as a microwave power combiner wherein the power outputs of a plurality of solid state microwave diode means are combined in a resonator cavity. Each solid state microwave diode means includes a solid state microwave diode, such as an IMPATT diode, and a coaxial circuit coupling its solid state microwave diode to the cavity. Each coaxial circuit includes an impedance transformation means, which can include a fixed low impedance transformer and a fixed length transmission line connected between the impedance transformer and the resonator cavity. A variable length transmission line is connected between the diode and the impedance transformation means.

In the specific embodiment described, a typical coaxial circuit consists of an electrically conductive, suitably gold-plated brass, rod which is spring biased along its longitudinal axis to hold a solid state microwave diode against a lock screw which is adjustable to position the diode along such longitudinal axis against the spring load. The rod is disposed in various size bores in a conductive block structure which thereby comprises the outer conductor of the coaxial circuit, the rod being the inner conductor. The rod, between the diode and the cavity, is generally of uniform outer diameter and passes through a restricted bore to comprise the low impedance transformer. Thus, as the diode position is adjusted along the longitudinal axis of the rod, the electrical length of rod extending between the restricted bore and the diode varies accordingly while the electrical length of the rod within the restricted bore remains constant. The length of the coaxial transmission line between the diode and the low impedance transformer is thus adjustable. In addition, in this embodiment, the electrical length of rod between the low impedance transformer and the cavity, and hence the corresponding coaxial transmission line, remains constant as the position of the diode is adjusted.

The main advantage of the invention is that it allows the diodes of a solid state microwave diode power combiner to be individually tuned to the cavity by effectively varying the series inductance between the diode and the low impedance transformer.

Another advantage of the invention is that it provides individual tuning means for such coaxial circuits wherein the required range of movements to tune various diodes to a cavity is within convenient limits.

BRIEF DESCRIPTION OF THE DRAWINGS

FIG. 4 shows a lock screw used for adjusting the position of a solid state microwave diode.

FIG. 5 is a Smith chart which helps to explain the general principles of the invention.

FIG. 6 is a schematic diagram of a typical coaxial circuit which couples a solid state microwave diode to a resonator cavity.

DESCRIPTION OF THE PREFERRED EMBODIMENT

Although a number of resonant structures or cavities can be used for summing the power of individual IMPATT diodes, a power summer embodied as a $TM_{010}$ mode cavity power combiner will be described to explain the present invention. This basic cavity power combiner has been described by R. S. Harp and H. L. Stover in a paper, THPM 10.3, "Power Combining of X-Band IMPATT Circuit Modules", given Feb. 15, 1973 at the IEEE ISSCC. Improvements to the basic structure were described by R. S. Harp and K. J. Russell in a paper, THAM 9.2, "Improvements in Bandwidth and Frequency Capability of Microwave Power Combinatorial Techniques", given on Feb. 14, 1974 at the IEEE ISSCC. These basic power combiners are generally conventional and well known to those skilled in the art, thus one should consult the literature for specific details of their construction and operation, the description below of certain details of the cavity power combiner being merely to orient the present invention in its environment.

Figure 1:
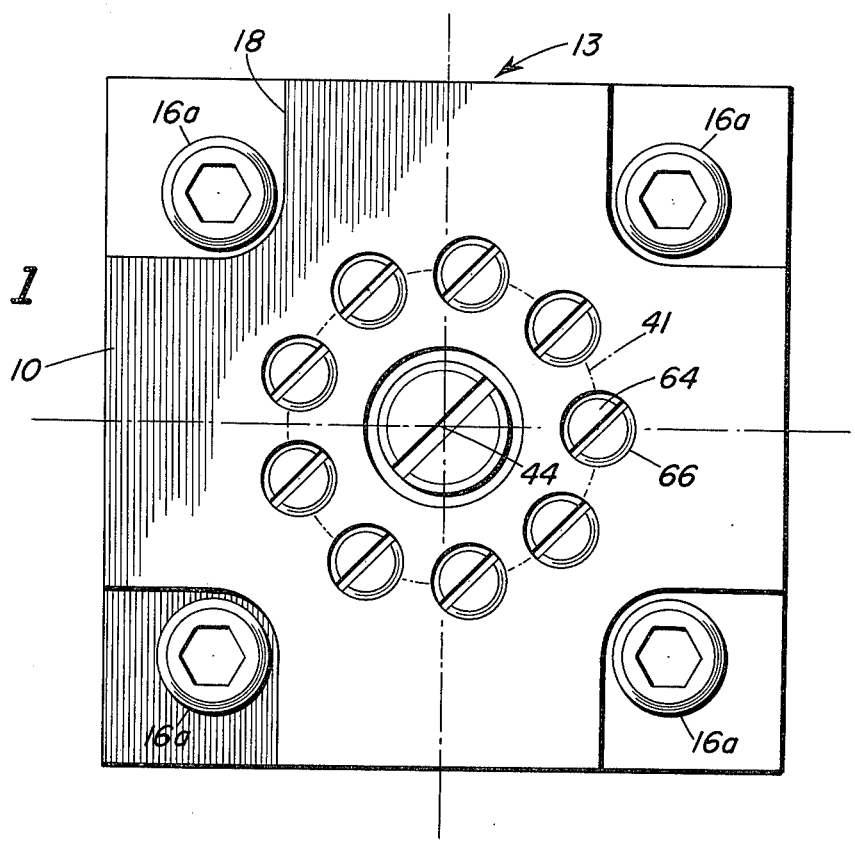
FIG. 1 is a plan view of a 9 diode cavity power combiner.
Figure 3:
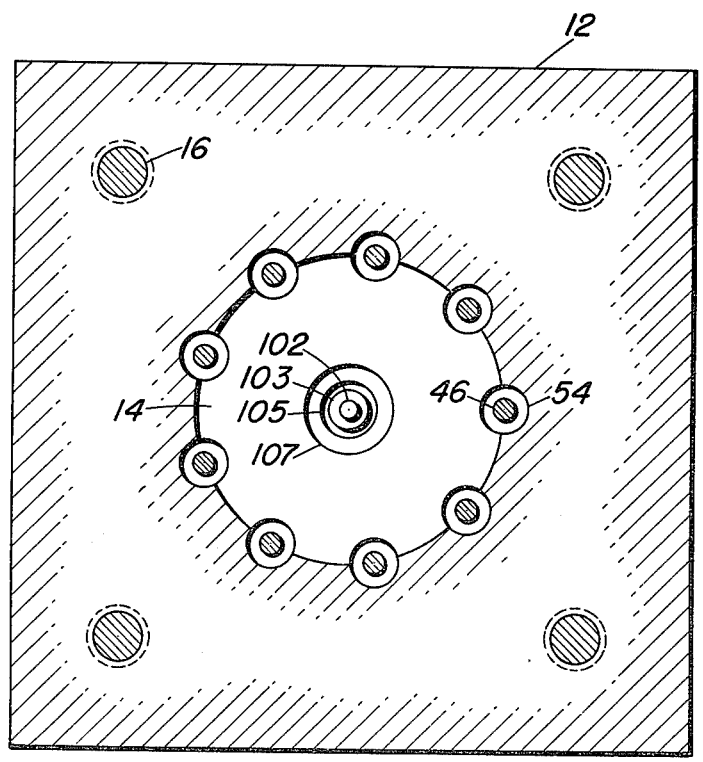
FIG. 3 is a sectional view taken along line 3—3 of FIG. 2.
Figure 2:
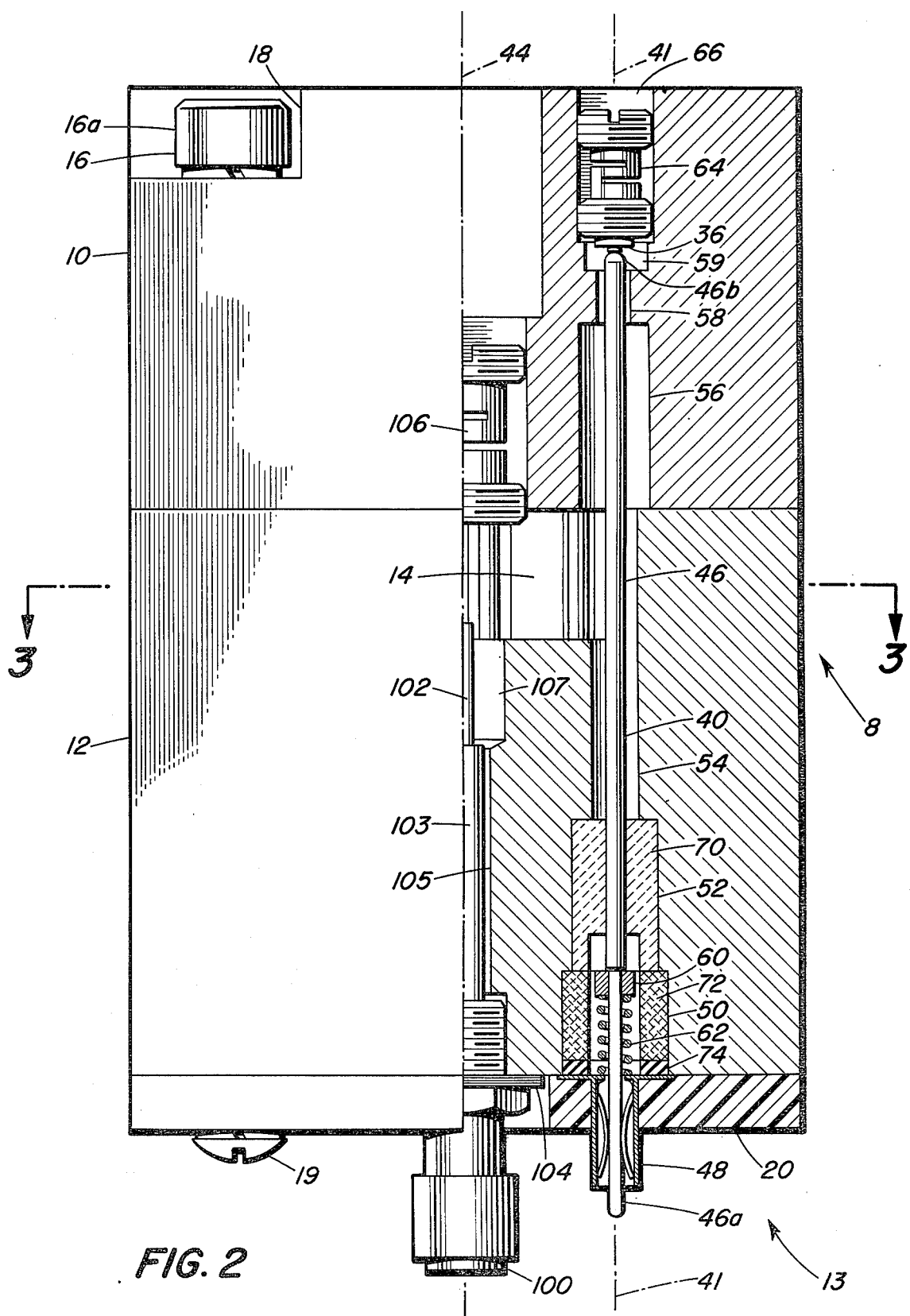
FIG. 2 is a partially cut away side view of the device of FIG. 1 showing a typical coaxial circuit which couples a typical diode to a resonator cavity.

FIGS. 1 and 2 are respectively the plan and partially cut away side view of a 9 diode microwave cavity power combiner 13 using the present invention. Referring to these figures wherein like numerals designate the same items, a 9 diode cavity device 13 is comprised of a two piece aluminum block structure 8 having a top piece 10, and a bottom piece 12. The cavity 14 proper is a circularly symmetrical void formed into bottom piece 12 and having scallops which are a continuation of bores 54 into the cavity (FIG. 3). For X-band, as in the present embodiment, the cavity is 2.03 cm in diameter (excluding scallops) by 0.76 cm high. The two pieces 10 and 12 are held together by screws located at the corners of the block and exemplified by screw 16 whose head 16a is conveniently recessed in cut away section 18. Attached to block structure 8 is a non-conductive plate 20, suitably epoxy-fiberglass, fitted to block structure 8 through four screws 19 (only one of which is shown). As known to those skilled in the art electrical components (not shown) associated with power combiner 13 are normally mounted on board 20.

Nine coaxial circuits 40, each associated with an IMPATT diode, are located equally spaced on a circumference struck with respect to centerlines 44 of cavity 14. A typical one of the coaxial circuits 40 is seen in full in the cut away portion of FIG. 2. A typical coaxial circuit 40 consists of a gold-plated brass rod 46 which extends from end 46a externally to combiner 13 through a circuit connection socket 48 which is electrically connected to the circuitry of the device. Rod 46 then extends through successively smaller bores 50, 52 and 54 and cavity 14 in bottom piece 12, and through bores 56, 58 and 59 in piece 10. Rod 46 is fitted with a collar 60. A coil spring 62 bears between collar 60 and the underside of circuit connection socket 48 to spring bias rod 46 against IMPATT diode 36 which is screwed into a lock screw 64 which is disposed in threaded bore 66.

Lock screw 64 is seen in greater detail in FIG. 4, reference to which should now be made. Lock screw 64 is a single metal piece having externally threaded cylindrical ends 64a and 64b separated by a reduced diameter stem 64c. Two cuts 64d and 64e are made from opposite ends laterally into stem 64c. These cuts cause threaded ends 64a and 64b to spring load one another so as to lock the device against vibration when both ends are fitted into a threaded bore such as bore 66. Lock screw 64 can thus be adjusted along its longitudinal axis by screwing into or out of bore 66 and it will remain where adjusted.

Returning to FIGS. 1 and 2, rod 46 is generally the center conductor of a coaxial transmission line coupling IMPATT diode 36 into cavity 14 and, more specifically, is comprised of a section of adjustable length transmission line where the rod is within bore 59, a fixed impedance transformer where the rod is within bore 58, a second fixed length transmission line where the rod is within bore 56, and an interactive region which constitutes a magnetic coupling mechanism between the IMPATT diode and the cavity where the rod is within cavity 14. The rod continues through a half wavelength transmission line section where the rod is within bore 54. The transmission line is terminated by a microwave lossy material 70 within bore 52. The lossy nature of material 70 provides suppression of moding (and some bias circuit oscillation) as originally discussed by K. Kurokawa and F. M. Magalhaes in "An X-Band Ten Watt Multiple IMPATT Oscillator", Proc. IEEE (Letters) pages 101–103, January 1971. The use of blunt ends as shown on material 70, as is preferable, instead of the more normal tapered geometry known in the art, as well as the careful choice of electrical length between the material and the cavity proper, also as known to those skilled in the art, causes a reduction in the loss of cavity power which is here accepted to achieve the desired stabilization of diode operation.

Rod 46 passes through a ferrite bead 72 in bore 50. This ferrite bead provides additional lower frequency stabilization for the coaxial circuit. A foam rubber collar spacer is inserted between bead 72 and board 20 to prevent movement of ferrite bead 72 and lossy material 70.

RF coupling to cavity 14 is through a coaxial connector 100 mounted centrally in block structure 8 and having a center conductor or probe 102 which extends into cavity 14. The degree of cavity coupling can be adjusted by changing the thickness of the spacing washer stack 104 located under the head of connector 100. Cavity frequency adjustment is made through the use of a plunger or tuning rod 106 in the form of a lock screw similar to that shown in FIG. 4, screwed into bottom piece 12. If probe 102 penetration into cavity 14 is increased, cavity coupling is increased, the resistive loading increases and the cavity output RF level increases. If the penetration of tuning plunger 106 into the cavity is increased, the cavity resonant frequency decreases.

Referring now to the coaxial circuit 40 of FIG. 2 and particularly where rod 46 passes through bore 58 to form an impedance transformer and bore 56 to form a fixed length transmission line. As lock screw 64 is adjusted to move IMPATT diode 36 along the longitudinal axis of rod 46, the impedance transformer at bore 58, the transmission line at bore 56, which is here one-half wavelength long, and the interaction region in cavity 14, remain of fixed length. However, the length of transmission line comprised of rod 46 in bore 59 varies with the position of IMPATT diode 36. This variation in the length of the transmission line comprised of rod 46 in bore 59 permits each diode to be individually tuned to cavity 14. In this manner, a fairly broad spectrum of individual diodes can be accommodated by the same cavity.

Refer now to FIG. 3 which is a sectional view taken along line 3—3 of FIG. 2. This figure illustrates the scalloped nature of cavity 41 within block 12 which is caused by the nine bores 54 (only one of which is marked by a legend) through which rods 46 pass. Also seen is probe 102, which is connected to the center conductor of connector 100 of FIG. 2, within bore 107. An extension 103 of the outer conductor of connector 100 is seen within concentric bore 105. The elements of this FIG. 3 are also seen in the cut-away section of FIG. 2 in front view.

Refer now to FIG. 6 which is an equivalent circuit schematic of coaxial circuit 40 and IMPATT diode 36 of the earlier figures. Diode 36 is represented by a fixed impedance $Z_D$ coupled to cavity 14 through transmission line sections 59a, 58a and 56a. Section 59a is a variable inductance which corresponds to the variable length of the transmission line comprised of rod 46 in bore 59. Section 58a corresponds to the fixed impedance transformer comprised of rod 46 in bore 58, while section 56a corresponds to the fixed length of transmission line comprised of rod 46 in bore 56. This equivalent circuit is plotted on the Smith chart of FIG. 5, reference to which should also be made. The negative complex conjugate of the impedances of a group of typical IMPATT diodes will lie within certain limits and it is assumed that the negative complex conjugate of the impedance of any one of such diodes will plot on the Smith chart of FIG. 5 somewhere within bold line 120. As known to those skilled in the art, the negative complex conjugate is an artifice for using a positive real Smith chart and transforming diode variations to the cavity interaction region. It is known that to tune a particular IMPATT diode to the cavity it must present an impedance at the cavity which plots at point 126a, that is on the real axis of the Smith chart. The curve, comprised of fixed sectors 124 and 126 which respectively correspond to the series variable inductive reactance introduced by variable line length 59a of FIG. 6 and transmission line 58a also of FIG. 6, is fixed by the circuit components to a predetermined form and length. The half-wavelength transmission line, comprised of rod 46 in bore 56 of FIG. 2 and shown schematically as element 56a of FIG. 6, translates the impedance 126a 360° around the Smith chart and back to itself, albeit now in cavity 14 at the interaction region. It is thus necessary to provide sufficient tuning capacity of the variable inductance of FIG. 6, which of course corresponds to the variable length of the transmission line comprised of rod 46 in bore 59, to span from any IMPATT diode, whose impedance plots within sector 120, to point 124a thereof. This scheme of tuning a diode by varying the length of transmission line between the diode and the impedance transformation, that is prior to the impedance transformer, provides a means of adjusting series inductance, the principal variant among diodes of a given type, so that tuning is not likely to result in undesirable changes in a real portion of the impedance. Additionally, as a result of tuning prior to the impedance transformation, a tuning range corresponding exactly to the differences of diode impedance values is required rather than the transformed and thus extended range of values which would be necessary to tune through should tuning be accomplished by varying the length of the transmission line between impedance transformer and the cavity. The required tuning of diode 36 of FIG. 2 is thus more effective than if tuning were to be accomplished by the prior art means, so that the physical realization of coaxial circuit 40 is made more practical. In addition, this invention permits "simultaneous" tuning, that is, all diodes can be tuned together rather than loading and tuning each diode sequentially. This, of course, greatly reduces test time.

The invention claimed is:

1. A microwave power combiner comprising:
   a resonator cavity;
   a plurality of coaxial circuits, each having a longitudinal axis, a solid state microwave diode at one end of the circuit, and means coupling said diode to said resonator cavity comprising, in series, a first transmission line of adjustable length having one end connected to said diode, a second transmission line forming a fixed impedance transformer having an end connected to the other end of said first transmission line of adjustable length, and a third transmission line of fixed length connected between the other end of said fixed impedance transformer and said resonator cavity.

2. The power combiner of claim 1 wherein said first, second and third transmission lines of said means coupling said diode to said resonator cavity comprise a single unitary rod having a lingitudinal axis which generally coincides with the longitudinal axis of its associated coaxial circuit.

3. The power combiner of claim 1 wherein said first transmission line of adjustable length is adjustable along the longitudinal axis of its associated coaxial circuit.

4. The power combiner of claim 2 wherein said rod is generally of single uniform diameter along its effective length between said diode and said resonator cavity.

5. The power combiner of claim 4 including housing means defining said resonator cavity, said plurality of coaxial circuits being mounted within cylindrical bores in said housing means and communicating with said resonator cavity, each of said cylindrical bores having a restricted diameter section defining the fixed impedance transformer of its associated coaxial circuit.

6. The power combiner of claim 5 wherein each of said rods extends at least from its associated diode, through its associated restricted diameter section into said resonator cavity.

7. The power combiner of claim 6 including means for adjustably supporting each of said diodes along the longitudinal axis of its associated rod and means for mechanically biasing its associated rod along its longitudinal length against its associated diode.

8. An adjustable microwave power combiner for a plurality of coaxially mounted microwave diodes, comprising
   a conductive body;
   a cylindrical resonator cavity formed in said body, said cavity having a longitudinal axis;
   means for coupling microwave energy out of said cavity and a plurality of coaxial microwave diode mounting circuits formed in said body, each said mounting circuit comprising a generally cylindrical bore having a longitudinal axis extending parallel to the axis of said cavity, said bore penetrating and extending through said cavity along the circumferential wall thereof;

a portion of said bore having a diameter reduced below the nominal bore diameter, the reduced diameter portion being spaced along the length of said bore on one end of and away from said cavity;

a conductive rod extending coaxially in said bore through said cavity and through said reduced diameter portion of said bore with an end portion of said rod projecting beyond said reduced diameter portion;

an adjustable mounting screw threaded in said bore in facing relationship to the end of said projecting end portion of said rod;

a microwave diode interposed between said mounting screw and the end of said projecting end portion of said rod;

a bushing of microwave lossy material coaxially supporting said rod in said bore, said bushing being spaced along the length of said bore on the opposite end of and away from said cavity;

spring means in said bore adjacent said bushing for mechanically biasing the end of said rod into contact with said diode;

said projecting end portion of said rod forming a first transmission line of adjustable length, the portion of said rod within said reduced diameter portion of said bore and colinear therewith forming, in conjunction with said reduced diameter portion, a second transmission line providing a fixed impedance transformation, the portion of said rod extending from said reduced diameter portion of said bore through said cavity and into said bushing forming a third transmission line of fixed length, said first, second and third transmission lines being in series; and means for applying electrical bias to said rod.

* * * * *